United States Patent [19]
Tsurumaru

[11] Patent Number: 5,918,204
[45] Date of Patent: Jun. 29, 1999

[54] SPEECH FRAME DISABLING CIRCUITRY FOR PROTECTION AGAINST BURST ERRORS OF INTERLEAVED TDMA FRAMES

[75] Inventor: Makoto Tsurumaru, Tokyo, Japan

[73] Assignee: NEC Corporation, Tokyo, Japan

[21] Appl. No.: 08/773,835

[22] Filed: Dec. 27, 1996

[30]     Foreign Application Priority Data

Dec. 27, 1995 [JP] Japan .................................. 7-341519

[51] Int. Cl.[6] ........................................................ G10L 3/02
[52] U.S. Cl. .......................... 704/214; 704/226; 704/242; 704/233; 704/244
[58] Field of Search ..................................... 704/214, 226, 704/242, 205; 371/37.4, 32, 43, 31, 5.1, 45; 330/279

[56]                References Cited

U.S. PATENT DOCUMENTS

| | | | |
|---|---|---|---|
| 4,933,934 | 6/1990 | Aikoh et al. | 370/433 |
| 5,073,940 | 12/1991 | Zinser et al. | 704/226 |
| 5,101,176 | 3/1992 | Norimatsu | 330/279 |
| 5,255,343 | 10/1993 | Su | 704/242 |
| 5,271,042 | 12/1993 | Borth et al. | 375/101 |
| 5,412,696 | 5/1995 | Uriya et al. | 375/354 |
| 5,416,788 | 5/1995 | Carey | 370/347 |
| 5,432,778 | 7/1995 | Minde et al. | 370/347 |
| 5,450,442 | 9/1995 | Umemoto et al. | 375/230 |
| 5,550,543 | 8/1996 | Chen et al. | 341/94 |
| 5,572,516 | 11/1996 | Miya et al. | 370/342 |
| 5,581,651 | 12/1996 | Ishino et al. | 704/205 |

*Primary Examiner*—Richemond Dorvil
*Assistant Examiner*—Vijay B. Chawan
*Attorney, Agent, or Firm*—Foley & Lardner

[57]             ABSTRACT

A speech frame is converted to speech bursts and interleaved over a predetermined number of TDMA frames for transmission. At a receive site, the transmitted signal is equalized and a quality signal indicating the quality of each burst signal is produced from the equalized signal. The equalized signal is de-interleaved, and then Vitrerbi-decoded speech samples are produced. A CRC circuit performs an error check operation on the decoded speech samples to produce an error bit if a speech frame failed the check. A decision circuit compares the quality signal with a first reference value and produces a first disable signal when it is lower than the first reference value. The decision circuit compares a total sum of the quality signals produced from the predetermined number of burst signals with a second reference value and produces a second disable signal when the total sum of the quality signals is lower than the second reference value. A speech decoder operates on the decoded speech samples to recover speech frames and masks speech frames in response to the error bit from the CRC circuit and the first and second disable signals from the decision circuit.

21 Claims, 4 Drawing Sheets

SPEECH FRAME DISABLING CIRCUITRY FOR PROTECTION AGAINST BURST ERRORS OF INTERLEAVED TDMA FRAMES

BACKGROUND OF THE INVENTION

1. Field of the Invention

The present invention relates generally to digital cellular mobile communications such as GSM (Global System for Mobile communications) systems, and more specifically to mobile radio telephone receiver susceptible to errors introduced to burst signals interleaved over several TDMA (time division multiple access) frames.

2. Description of the Related Art

According to the GSM standard, a 20-ms speech frame of 160 samples is converted into convolutional codes of rate ½ and block-diagonally interleaved over eight TDMA frames to provide protection against burst errors. At a mobile station site, a CRC (cyclic redundancy check) circuit is provided for performing in error check on de-interleaved, Viterbi-decoded speech samples. If an error is found, an error check bit is supplied to a speech decoder to disable a speech fame by muting its output or replacing the disabled frame with a predetermined speech pattern to prevent noise which would otherwise occur as a result of error bits. Specifically, the CRC circuit performs the error check by producing a 3-bit parity from the 50 most perceptually significant bits of 260 user information bits using the polynomial $g(D)=D^3+D+1$. However, if a significant amount of error occurs due to the presence of local obstructions or multipath fades or an interruption of transmission, the speech decoder is likely to falsely treat the transmitted signal as containing normal speech frames with a probability of 12.5% ($=(2^{47}-1)/2^{50} \times 100$). Thus, the speech decoder produces unpleasant noise with a predetermined probability when burst errors occur.

SUMMARY OF THE INVENTION

It is therefore an object of the present invention to avoid the unpleasant noise when burst errors occur in the transmitted interleaved TDMA signals.

According to the present invention, there is provided a circuit arrangement for a communication unit which receives a predetermined number of burst signals interleaved over a corresponding number of TDMA (time division multiple access) frames for recovering a speech sample, comprising equalizer circuitry for producing equalized speech samples from the received burst signals according to an inverse transfer function of a radio link through which the frames are received and a quality signal indicating a quality value of each of the burst signals, de-interleaver circuitry for de-interleaving the equalized speech samples, a channel decoder for operating on the de-interleaved speech samples to produce decoded speech samples, and a CRC circuit for performing a CRC (cyclic redundancy check) operation on the decoded speech samples to produce an error check signal in the presence of an error in the decoded speech samples. A decision circuit compares the quality signal with a first reference value and produces a first disable signal when the quality signal is lower than the first reference value, or compares a total sum of the quality signals produced from the predetermined number of the burst signals with a second reference value and produces a second disable signal when the total sum of the quality signals is lower than the second reference value. A speech decoder operates on the decoded speech samples to recover a speech frame and masks speech frames in response to the error check signal from the CRC circuit and in response to the first or second disable signal from the decision circuit.

BRIEF DESCRIPTION OF THE DRAWINGS

The present invention will be described in further detail with reference to the accompanying drawings, in which.

DETAILED DESCRIPTION

The channel coding technique employed in the GSM system for the encoded speech uses a convolutional code of rate ½, block-diagonally interleaved over eight TDMA frames to provide protection against burst errors. The mobile station is assigned one of the eight time slots to transmit and receive bursts on the assigned time slots. In the GSM system, the 20-ms speech frame consists of 260 bits of user information. A 3-bit cyclic redundancy check is added to the 182 most significant bits of the user information making 185 bits, and 4 bits are added to initialize a channel decoder to produce 189 bits which are then presented to a ½ rate channel encoder, thereby producing 378 bits. The remaining 78 least significant coded speech bits, which are unprotected, are then added, making a total of 456 bits (=57×8). The channel encoder at the base station interleaves user information to enhance the performance of the error correction. A training sequence is added to the voice data which aids in data identification and is also used for equalization of the RF channel. Two blocks of 57 bits of voice data are interleaved by the channel encoder to spread out the user information over time slots. In the GSM system, each time slot contains two 57-bit user information bursts of successive speech frames and a training sequence inserted between these 57-bit user information bursts.

Figure 1:
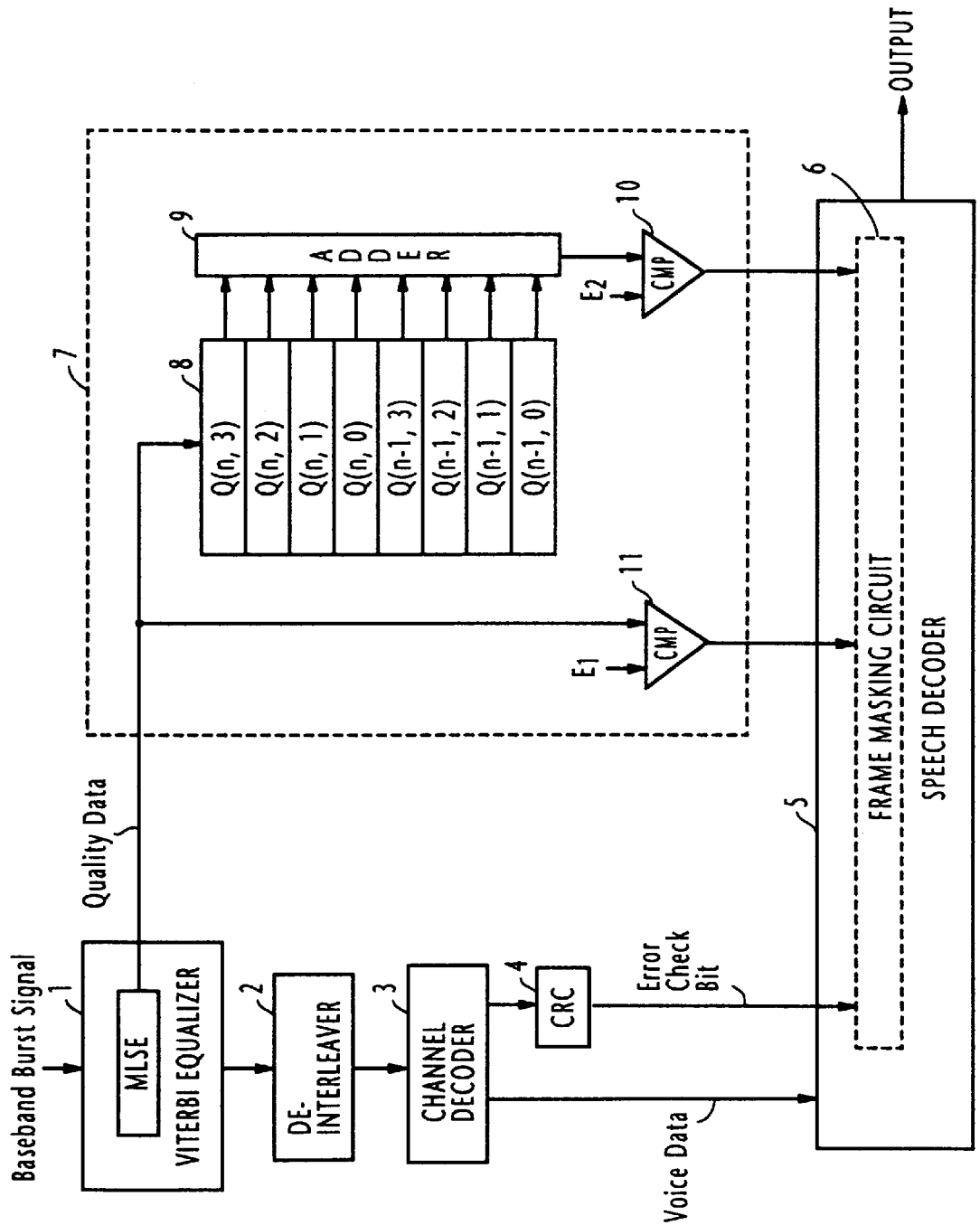
FIG. 1 is a block diagram of a receive section of a mobile unit of a digital cellular communication system according to a first embodiment of the present invention.

In FIG. 1, there is shown a receive section of a mobile station of the present invention for a TDMA (time division multiple access) cellular communication network. At the transmit site, user data bits are interleaved (spread) over several TDMA frames for purposes of correcting burst errors caused by a large amount of data loss. In the case of the GSM (Global System for Mobile communications) standards, the user bits of each voice frame are interleaved over eight TDMA frames. Signals transmitted on a forward channel from a given base station site are received by the mobile station and processed by an amplifier/demodulator stage, not shown, and a baseband signal of convolutional codes is recovered and applied to a Viterbi equalizer 1. The equalizer 1 compares the received bit pattern with the training sequence, adjusts the parameters of a digial filter so as to provide an inverse transfer function to that of the radio link between the base station and the mobile station, and produces an equalized speech sample. Intersymbol interference is canceled in this channel equalization process. Specifically, the equalizer 1 includes a maximum likelihood sequence estimator (MLSE) to perform a decoding operation on the input signal according to the Viterbi algorithm. Eight equalizer data output signals are produced in sequence corresponding to the eight bursts contained in respective TDMA frames. These data signals are supplied in sequence to a deinterleaver 2 where the original sequence is recovered and error corrected. The output of deinterleaver 2 is processed by a channel decoder 3 using the Viterbi algorithm to decode the convolutional codes. A CRC (cyclic redundancy check) circuit 4 is connected to the output of channel decoder 3 to produce an error check bit when a speech frame failed the CRC check.

A speech decoder 5 performs a decoding operation on the voice data output from the channel decoder 3 to produce a 160-sample speech frame of duration 20 milliseconds. Speech decoder 5 includes a frame masking circuit 6 for masking a bad speech frame. The frame masking is done in different ways, including a mode in which the speech is repeated and attenuated and a mode in which the speech is completely muted, depending on the number of consecutive error check bits from the CRC circuit 4.

Figure 2:
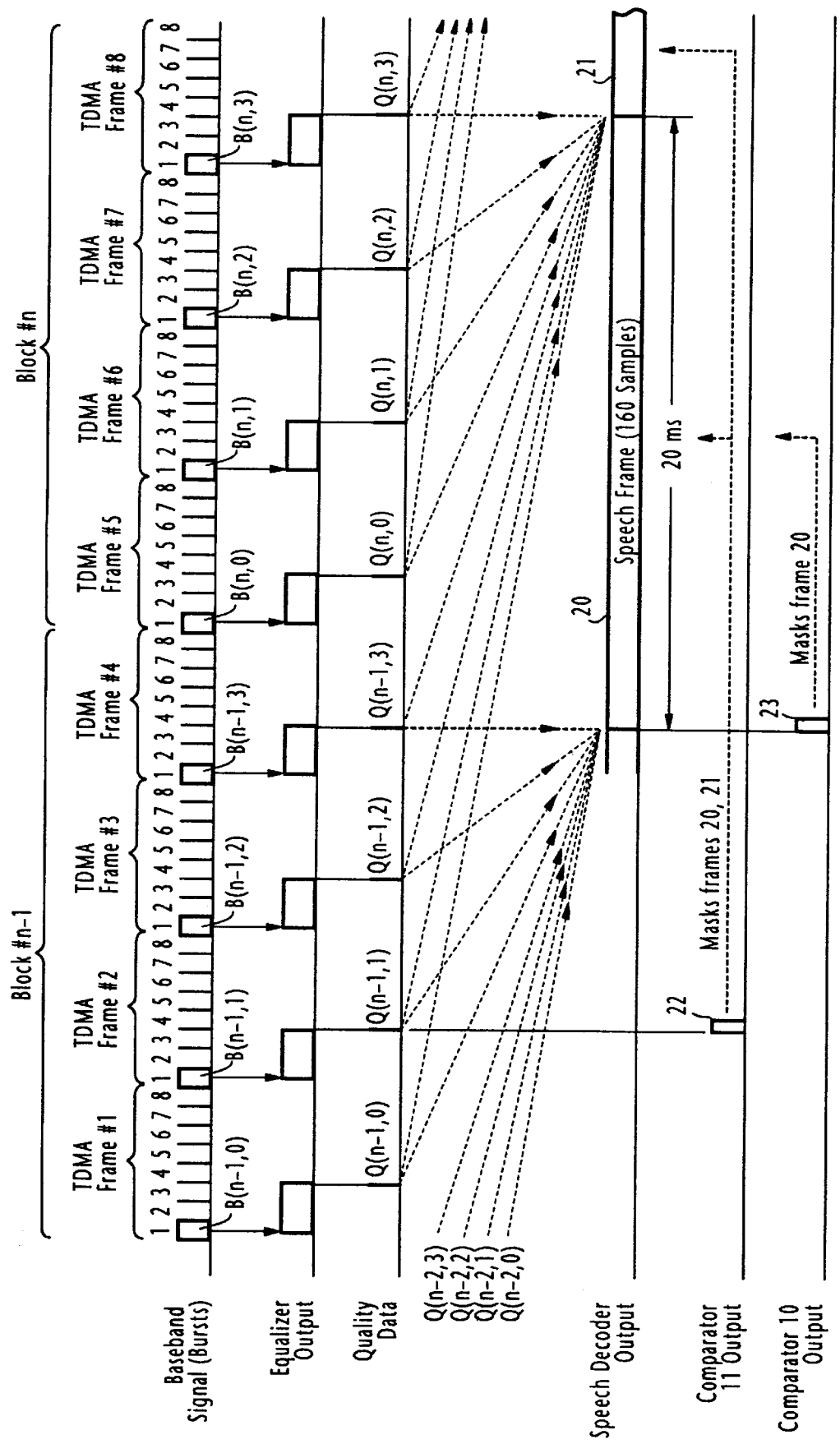
FIG. 2 is a timing diagram associated with FIG. 1.

In FIG. 2, it is shown that the mobile station is assigned the time slot #1. A sequence of eight frames #1 to #8 are divided into two blocks, and each baseband burst signal is identified as B(n, j), where n represents the block number and j=0, 1, . . . , 3 representing the sequence number of each burst signal in a block. A 20-ms speech frame is reconstructed from every eight bursts of time slots of the assigned number at every four-frame intervals.

According to the present invention, there is provided a quality decision circuit 7 which receives quality data from the Viterbi equalizer 1. This quality data is a soft-decision multibit signal which is produced by the maximum likelihood estimator of the equalizer 1 during the Viterbi algorithm estimation process in a manner as described in U.S. Pat. No. 5,271,042, issued to Borth et al, under the title "Soft Decision Decoding with Channel Equalization". In the quality decision circuit 7, a sequence of eight quality data are stored in a memory 8. The quality data derived from corresponding bursts B(n, j) are designated Q(n, j). The quality data are sequentially supplied to the memory 8 and stored therein. When a sequence of eight quality data are stored for a given speech frame, the first four quality data are discarded to vacate their storage locations and the second four quality data are shifted to the vacated locations, while allowing the first four quality data for the next speech frame to be sequentially stored in the memory 8. An adder 9 is provided for summing the eight quality data stored in memory 8 for each speech frame. The output of adder 9 is supplied to one input of a comparator 10 for comparison with a reference value $E_2$. A logic-1 or logic-0 output is produced by the comparator 10 when the overall quality of the eight-burst sequence is lower or higher than the threshold $E_2$, respectively. The output of comparator 10 is supplied to the frame masking circuit 6 as an overall quality decision output of the decision circuit 7.

Further provided is a comparator 11 that individually compares the sequentially produced quality data with a reference value $E_1$ that is less than one-eighth of reference value $E_2$. A logic-1 or logic-0 output is produced from comparator 11 when the quality of each burst is lower or higher than the threshold $E_1$, respectively. The output signal of comparator 11 is supplied to the frame masking circuit 6 as an individual decision output of the decision circuit 7.

It is seen that a logic-1 (poor quality) decision output is produced by comparator 11 when the quality of at least one of the eight baseband bursts is lower than the threshold $E_1$ even when the overall quality of these bursts is not lower than threshold $E_1$, and a logic-1 decision output is also produced by comparator 10 when the total quality of eight successive bursts is lower then threshold $E_2$ even when the quality of any of the individual baseband bursts is not lower than threshold $E_1$.

The speech decoder 5 uses the individual quality decision signal for masking two successive speech frames since a low-quality burst signal is associated with two frames, and uses the overall quality decision signal for masking one speech frame since it is identified by the overall quality decision signal.

If quality data Q(n−1, 1) is lower than threshold $E_1$, a logic-1 decision output is produced as indicated by numeral 22 in FIG. 2. Since the corresponding burst signal B(n−1,1) contains two 57-bit user information bursts of successive speech frames, the speech decoder 5 uses this logic-1 decision output for masking speech frames 20 and 21. If the total quality of eight burst signals B(n−2, 0) to B(n−1, 3) is lower than threshold $E_2$, comparator 10 produces a logic-1 output as indicated by numeral 23 at the instant quality data Q(n−1, 3) is stored into memory 8. Since the total quality of eight burst signals B(n−2, 0) to B(n−1, 3) is only associated with one speech frame, the frame masking circuit 6 uses the comparator 10 output to mask the speech frame 20.

Figure 3:
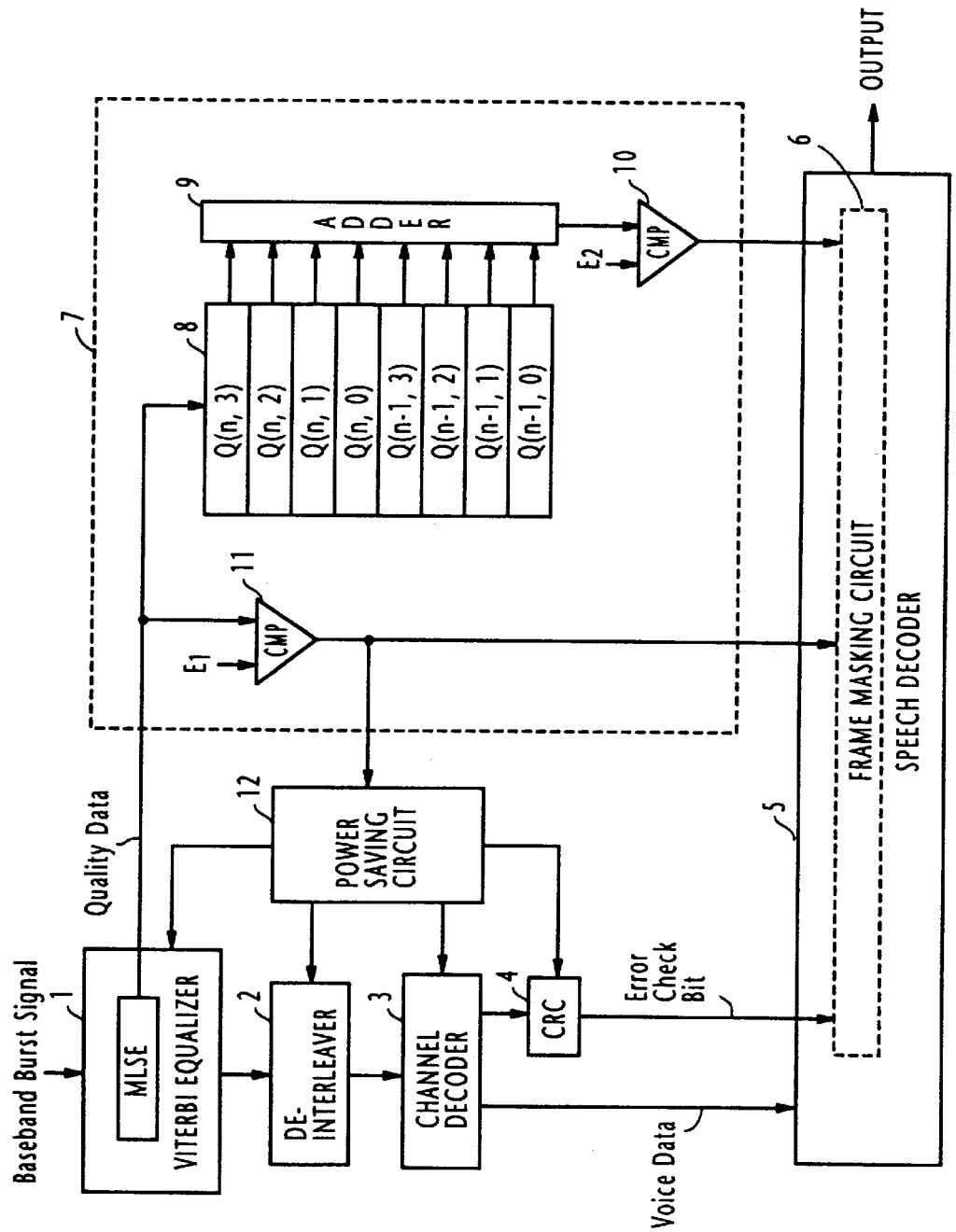
FIG. 3 is a block diagram of a modified embodiment of the present invention.
Figure 4:
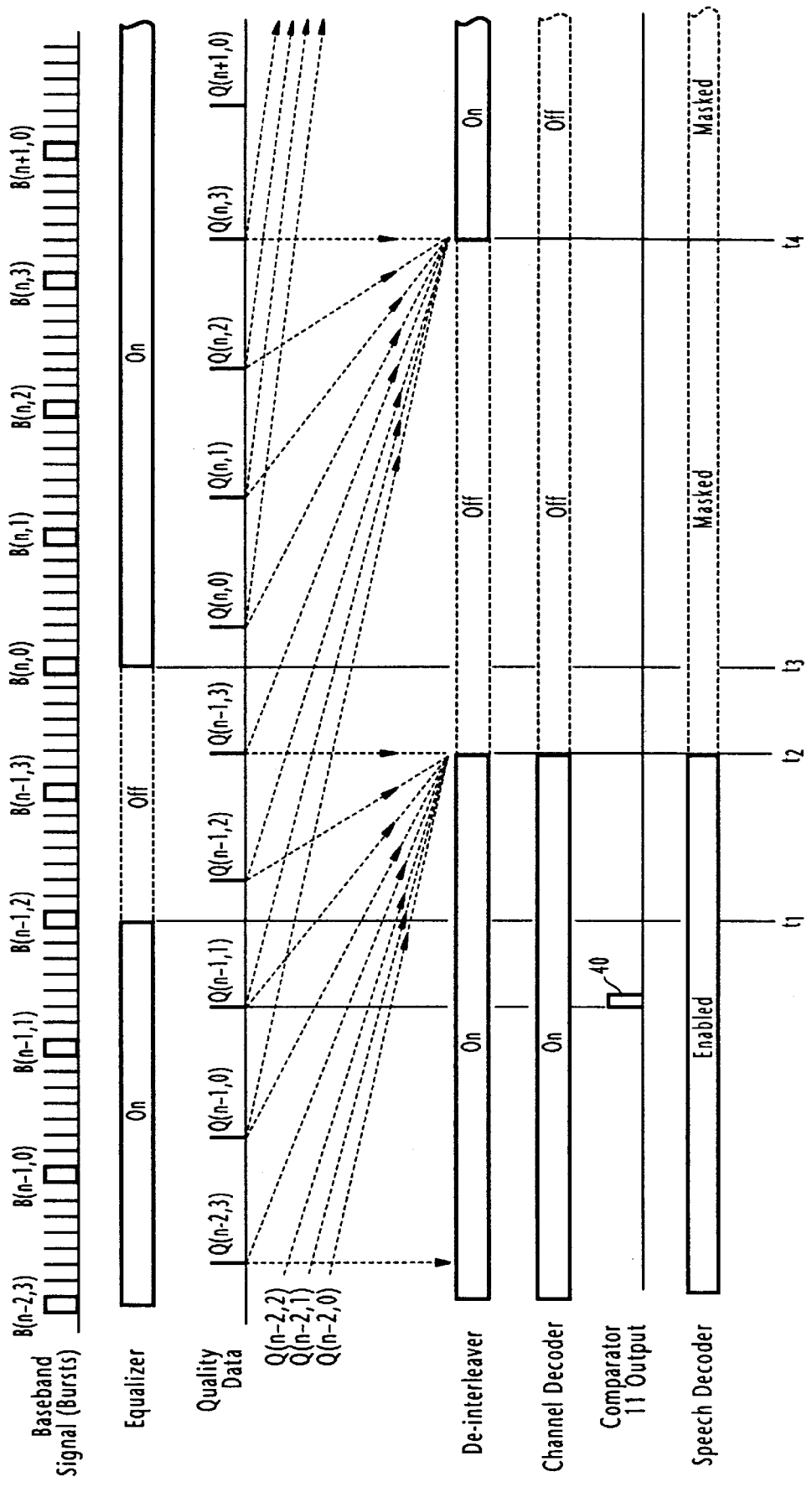
FIG. 4 is a timing diagram associated with FIG. 3.

In a modified embodiment shown in FIG. 3, a power saving circuit 12 provided for deactivating part of the equalizer other than the MLSE estimator, the de-interleaving and channel decoding operations and the CRC processing in response to a logic-1 output of comparator 11. This power saving operation is to conserve energy which would be uselessly dissipated when speech frames are being masked. The operation of the power saving circuit 12 is illustrated in FIG. 4.

If quality data (Qn−1, 1) is lower than threshold $E_1$, comparator 11 produces an output pulse 40. In response, the power saving circuit 12 turns off part of the equalizer 1 other than its MSLE during a period between times $t_1$ and $t_2$. De-interleaver 2 is deactivated between times $t_2$ and $t_4$ and channel decoder 3 is deactivated during two speech-frame intervals beginning at time $t_3$. Frame circuit 6 of speech decoder 5 masks two speech frames which occur successively following the decision output 40.

Note that equalizer 1 is activated again at time $t_3$ because it is necessary to perform equalization on the next sequence of eight bursts that start with a burst signal B(n,0). In addition, de-interleaver 2 is activated again at time $t_4$ because the burst signals of the next sequence must be de-interleaved.

What is claimed is:

1. A circuit arrangement for a communication unit which receives bust signals interleaved over a predetermined number of TDMA (time division multiple access) frames, comprising:

equalizer circuitry for producing equalized samples from the received burst signals according to an inverse transfer function of a radio link through which said frames are received and a quality signal indicating a quality value of each of the received burst signals;

de-interleaver circuitry for de-interleaving the equalized speech samples;

a channel decoder for operating on the de-interleaved speech samples to produce decoded speech samples;

a CRC circuit for performing a CRC (cyclic redundancy check) operation on the decoded speech samples to produce a disable signal in the presence of an error in the decoded speech samples;

a comparator for comparing said quality signal from said equalizer circuitry with a reference value and producing a disable signal when the quality signal is lower than the reference value; and a speech decoder for operating on the decoded speech samples to recover speech frames and masking speech frames in response to the disable signal from said CRC circuit and said comparator.

2. A circuit arrangement as claimed in claim 1, further comprising:
a memory for storing a sequence of quality signals produced by said equalizer corresponding to the predetermined number of said TDMA frames;
an adder for producing a total sum of the quality signals stored in said memory; and
an additional comparator for comparing the total sum with an additional reference value and producing a second disable signal when the total sum of said quality signals is lower than the additional reference value,
said speech decoder being responsive to the second disable signal from said additional comparator for masking speech frames.

3. A circuit arrangement as claimed in claim 1, further comprising power saving circuitry for deactivating part of said equalizer circuitry in response to said disable signal.

4. A circuit arrangement as claimed in claim 3, wherein said power saving circuitry deactivates said channel decoder in response to said disable signal.

5. A circuit arrangement as claimed in claim 1, further comprising power saving circuitry for deactivating said channel decoder in response to said disable signal.

6. A circuit arrangement as claimed in claim 1, wherein said quality signal is multibit soft decision information.

7. A circuit arrangement as claimed in claim 1, wherein said burst signals are provided to said communication unit and other communication units in TDMA blocks, wherein each block includes n frames, n being an integer greater than one,
wherein the de-interleaving circuitry is performed on data received from two consecutive ones of said blocks,
wherein, when said disable signal is received by said speech decoder, a current block and a future block adjacent in time to said current block are masked by said speech decoder, and
wherein, when said second disable signal is received by said speech decoder, only the current block is masked by said speech decoder.

8. A circuit arrangement for a communication unit which receives burst signals interleaved over a predetermined number of TDMA (time division multiple access) frames, comprising:
equalizer circuitry for producing equalized speech samples from the received burst signals according to an inverse transfer function of a radio link through which said frames are received and a quality signal indicating a quality value of each of the burst signals;
de-interleaver circuitry for de-interleaving the equalized speech samples;
a channel decoder for operating on the de-interleaved speech samples to produce decoded speech samples;
a memory for storing a sequence of quality signals produced by said equalizer corresponding to the predetermined number of said TDMA frames;
an adder for producing a total sum of the quality signals stored in said memory; and
a comparator for comparing the total sum of the quality signals with a reference value and producing a disable signal when the total sum of the quality signals is lower than the reference value; and
a speech decoder for operating on said decoded speech samples to recover speech frames and masking speech frames in response to the disable signals from said CRC circuit and said comparator.

9. A circuit arrangement as claimed in claim 8, wherein said quality signal is multibit soft decision information.

10. A cellular mobile unit for receiving burst signals interleaved over a predetermined number of TDMA (time division multiple access) frames, comprising:
equalizer circuitry for producing equalized speech samples from the received burst signals according to an inverse transfer function of a radio link through which said frames are received and a quality signal indicating a quality value of each of the received burst signals;
de-interleaver circuitry for de-interleaving the equalized speech samples;
a channel decoder for operating on the de-interleaved speech samples to produce decoded speech samples;
a CRC circuit for performing a CRC (cyclic redundancy check) operation on the decoded speech samples to produce a disable signal in the presence of an error in the decoded speech samples;
a comparator for comparing said quality signal from said equalizer circuitry with a reference value and producing a disable signal when the quality signal is lower than the reference value; and
a speech decoder for operating on said decoded speech samples to recover speech frames and masking speech frames in response to the disable signals from said CRC circuit and said comparator.

11. A cellular mobile unit as claimed in claim 10, further comprising:
a memory for storing a sequence of quality signals produced by said equalizer corresponding to the predetermined number of said TDMA frames;
an adder for producing a total sum of the quality signals stored in said memory; and
an additional comparator for comparing the total sum of the quality signals with an additional reference value and producing a second disable signal when the total sum of the quality signals is lower than the additional reference value,
said speech decoder being responsive to the second disable signal from the said additional comparator for masking speech frames.

12. A circuit arrangement as claimed in claim 11, wherein said burst signals are provided to said communication unit and other communication units in TDMA blocks, wherein each block includes n frames, n being an integer greater than one,
wherein the de-interleaving circuitry is performed on data received from two consecutive ones of said blocks,
wherein, when said disable signal is received by said speech decoder, a current block and a future block adjacent in time to said current block are masked by said speech decoder, and
wherein, when said second disable signal is received by said speech decoder, only the current block is masked by said speech decoder.

13. A cellular mobile unit as claimed in claim 10, further comprising power saving circuitry for deactivating part of said equalizer circuitry in response to said disable signal.

14. A cellular mobile unit as claimed in claim 13, wherein said power saving circuitry deactivates said channel decoder in response to said disable signal.

15. A cellular mobile unit as claimed in claim 10, further comprising power saving circuitry for deactivating said channel decoder in response to said disable signal.

16. A cellular mobile unit as claimed in claim 10, wherein said quality signal is multibit soft decision information.

17. A cellular mobile unit for receiving burst signals interleaved over a predetermined number of TDMA (time division multiple access) frames, comprising:

- equalizer circuitry for producing equalized speech samples from the received burst signals according to an inverse transfer function of a radio link through which said frames are received and a quality signal indicating a quality value of each of the received burst signals;
- de-interleaver circuitry for de-interleaving the equalized speech samples;
- a channel decoder for operating on the de-interleaved speech samples to produce decoded speech samples;
- a memory for storing a sequence of quality signals produced by said equalizer corresponding to the predetermined number of said TDMA frames;
- an adder for producing a total sum of the quality signals stored in said memory; and
- a comparator for comparing the total sum at a reference value and producing a disable signal when the total sum of the quality signals is lower than the reference value; and
- a speech decoder for operating on said decoded speech samples to recover speech frames and masking speech frames in response to the disable signals from said CRC circuit and said comparator.

18. A cellular mobile unit as claimed in claim 17, wherein said quality signal is multibit soft decision information.

19. A method for masking speech frames, comprising:.

a) receiving burst signals interleavead over a predetermined number of TDMA (time division multiple access) frames;

b) producing equalized speech samples from the received burst signals according to an inverse transfer function of a radio link through which said frames are received and a quality signal indicating a quality value of each of the received burst signals;

c) de-interleaving the equalized speech samples;

d) performing a channel decoding operation on the de-interleaved speech samples to produce decoded speech samples;

e) comparing said quality signal with a reference value and producing a first disable signal when the quality signal is lower than the reference value, and performing a CRC (cyclic redundancy check) operation on the decoded speech samples to produce a second disable signal in the presence of an error in the decoded speech samples; and f) performing a speech decoding operation on said decoded speech sample to recover speech frames and masking speech frames in response to each one of the first and second disable signals.

20. A method for masking speech frames, comprising:

a) receiving burst signals interleaved over a predetermined number of TDMA (time division multiple access) frames;

b) producing equalized speech samples from the received burst signals according to an inverse transfer function of a radio link through which said frames are received and a quality signal indicating a quality value of each of the received burst signals, and storing, in a memory, a sequence of quality signals produced corresponding to the predetermined number of said TDMA frames;

c) de-interleaving the equalized speech samples;

d) performing a channel decoding operation on the de-interleaved speech samples to produce decoded speech samples;

e) comparing the quality signal produced from each burst signal with a first reference value and producing a first disable signal when the quality signal is lower than the first reference value;

f) performing a CRC (cyclic redundancy check) operation on the decoded speech samples to produce a second disable signal in the presence of an error in the decoded speech samples, producing a total sum of the quality signals stored in the memory and comparing the total sum of the quality signals with a second reference value, and producing a third disable signal when the total sum of the quality signals is lower than the second reference value;

g) performing a speech decoding operation on said decoded speech samples to recover speech frames and masking speech frames in response to each one of the first, second and third disable signals.

21. A method as claimed in claim 20, wherein the step g) includes the following sub-steps:

g1) when the first disable signal is produced, a current block of n frames and a future block of n frames are masked;

g2) when the second disable signal is produced, only the current block of n frames is masked; and g3) when the third disable signal is produced, only the current block of n frames is masked.

* * * * *